(12) United States Patent
Brigham et al.

(10) Patent No.: US 9,560,785 B1
(45) Date of Patent: Jan. 31, 2017

(54) MEZZANINE CARD SYSTEM

(71) Applicant: BAE Systems Information and Electronic Systems Integration Inc., Nashua, NH (US)

(72) Inventors: David A. Brigham, Bedford, NH (US); James F. Fung, Manchester, NH (US); Gregory S. Laste, Hudson, NH (US); Bryan A. Thibideau, Goffstown, NH (US); Joseph C. Brackett, Derry, NH (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 624 days.

(21) Appl. No.: 14/030,525

(22) Filed: Sep. 18, 2013

Related U.S. Application Data

(60) Provisional application No. 61/702,525, filed on Sep. 18, 2012.

(51) Int. Cl.
*H01R 12/00* (2006.01)
*H05K 13/00* (2006.01)
*H05K 7/10* (2006.01)

(52) U.S. Cl.
CPC ............... *H05K 7/10* (2013.01); *H05K 13/00* (2013.01)

(58) Field of Classification Search
CPC ....................................................... H01R 12/00
USPC ............................................................ 361/790
See application file for complete search history.

(56) References Cited

U.S. PATENT DOCUMENTS

| 6,805,560 B1* | 10/2004 | Budny | H01R 12/52 |
| | | | 439/65 |
| 2007/0152689 A1* | 7/2007 | Lee | G01R 1/07378 |
| | | | 324/754.18 |
| 2010/0163297 A1* | 7/2010 | Kajihara | H05K 3/0032 |
| | | | 174/264 |

* cited by examiner

*Primary Examiner* — Eric Thomas
*Assistant Examiner* — Michael P McFadden
(74) *Attorney, Agent, or Firm* — Sand & Sebolt, LPA; Daniel J. Long

(57) ABSTRACT

The mezzanine card system and method of use thereof provides a baseboard having opposing sides, each side configured to receive a mezzanine card thereon. A plurality of mezzanine cards are provided having integrated circuits, such as Field Programmable Gate Arrays, fixedly attached thereon. The mezzanine cards of the system reduce reprogramming time from about 15 months to about six weeks. This drastic reduction in reprogramming time provides great advantages for circuitry systems, especially when these systems are used within battlefield and electronic warfare technology. The surfaces of the baseboard are an Electroless Nickel, Electroless Palladium, and Immersion Gold (EN-EPIG) plated finish.

16 Claims, 8 Drawing Sheets

MEZZANINE CARD SYSTEM

CROSS REFERENCE TO RELATED APPLICATION

This application claims the benefit of U.S. Provisional Patent Application Ser. No. 61/702,525, filed Sep. 18, 2012; the disclosure of which is incorporated herein by reference.

BACKGROUND OF THE INVENTION

Technical Field

The present invention relates to electronic circuit systems. More particularly, the present invention relates to electronic circuit systems used within electronic warfare (EW) condition. Specifically, the present invention relates to a mezzanine circuit card system that allows new chips to be quickly reconfigured and redesigned and used with existing baseboards.

Background Information

An integrated circuit uses a network of metal interconnects between the individual semiconductor components, which are patterned with standard photolithographic processes during wafer fabrication. Multiple levels of metallized patterns may be used to increase the flexibility of the interconnects.

It has long been recognized that a user-programmable interconnect technique or manufacturer programmability just prior to shipment would allow lower tooling costs and faster delivery time. To such an end, gate array circuits were developed.

A gate array circuit is an array of uncommitted gates with uncommitted wiring channels. To implement a particular circuit function, the circuit is mapped into the array and the wiring channels and appropriate connections are programmed to implement the necessary wiring connections that form the circuit function. The gate array is programmed by developing digital computing tasks in software and compiling the tasks down to a configuration file or bitstream that contains information on how the components should be wired together.

A gate array circuit can be programmed to implement virtually any set of functions. Further, gate arrays can be programmed to implement custom hardware functionality without ever having to pick up a breadboard or soldering iron. Input signals are processed by a programmed circuit to produce the desired set of outputs. Such inputs flow from the user's system, through input buffers, then through the circuit, and finally back out to the user's system via output buffers. Such buffers provide any or all of the following input/output (I/O) functions: voltage gain, current gain, level translation, delay, signal isolation, or hysteresis.

If the wiring channels and appropriate connections are programmed by the manufacturer according to the construction masks, then the gate array circuit is described as a mask-programmable gate array.

If the wiring channels and appropriate connections are programmed by the user according to programmable circuit elements, then the gate array circuit is described as a Field Programmable Gate Array (FPGA).

Gate arrays are ordinarily affixed to a baseboard or motherboard. The baseboard is a static printed circuit board and main contain discrete components or sub-systems such as a processor. The purpose of the baseboard is to hold the crucial electrical components of the system and provide connections between the discrete components, like a connection from a gate array to a processor.

As advantageous as gate arrays have been herein above described, a problem continues to exist with their rapid improvement. Gate arrays continue to be permanently affixed to a hardwired baseboard. When an improved gate array is released by a manufacture, a baseboard must be reconfigured to accept the improved gate array. The baseboard reconfiguration process can take upwards of 15 months.

Others have attempted connecting circuits to mezzanine cards. A mezzanine card or daughterboard is a circuit board meant to be an extension or "daughter" of the baseboard or motherboard. In particular, mezzanine cards often have plugs, sockets, pins, connectors, or other attachments for other boards.

Commercial mezzanine cards, known in the prior art, are designed, in general, to be convection cooled by air. This way of cooling the mezzanine cards allows much better thermal cooling via heat transfer because all of the hot components are faced towards a cooling plate. The cooling plate is the cover of the module. This configuration allows each individual key discrete component (i.e., circuit, transistor, resistor, or the like) in a design to be attached to a mezzanine card so that if component fails, one may remove the mezzanine cards housing the failed component and attach another mezzanine card with having a new component. In general, these prior art mezzanine cards, e.g. FMC, XMC, PMC types, are commercial mezzanine card types that are designed to be air cooled. They can be adapted to be conduction cooled, but those conduction cooled boards are about 50% as dense as may be required for Electronic Warfare (EW) applications so that there may be less ability to input data to those cards and they tend to be much bigger physically.

Previously known and prior designs of durable pressure contact pads of a printed wired circuit on a motherboard or baseboard have been limited to a planar single side of the baseboard. This is because the pressure contact pads, which conduct the electrical signals, are normally electroplated. Often times, the pressure contact pads are electroplated with gold because of gold's excellent conductive and non-corrosive properties. Electroplating pressure contact pads with gold on both planar sides of the baseboard is not practical for most printed wiring board designs because of its increased production and manufacturing costs.

What is needed is a better way of using new integrated circuit chips such as FPGAs, transmitter chips, and receiver chips with existing baseboards.

SUMMARY

In accordance with one aspect of the invention, the mezzanine card system permits mezzanine cards having integrated semiconductor chips embedded thereon to be easily replaced when improved chip technology is released without the need for redesigning the hardware in the baseboard or motherboard. The mezzanine cards of system reduce the system reprogramming time from about 15 months to about six weeks. This drastic reduction in reprogramming time for the system provides great advantages for circuitry systems, especially when these systems are used within battlefield and electronic warfare (EW) technology.

In one aspect, the invention may provide a two-sided baseboard having an Electroless Nickel, Electroless Palladium, and Immersion Gold (ENEPIG) plated finish on one of or both planar sides of the printed wiring baseboard to provide a durable, hard, and corrosive resistant finish. The invention may further provide a mezzanine card that can be releasable secured via pressure from a securing member to either side of the baseboard. The mezzanine card has a dedicated integrated circuit, such as a field programmable gate array (FPGA), a transmitter, a receiver, and the like, attached thereon so the mezzanine card may be removed and swapped with a second mezzanine card, if or when a different type of circuit (FPGA, transmitter, receiver or the like) is later needed. This allows for a modular design without the need to redesign or re-solder the printed wire baseboard.

In another aspect, the invention may provide a mezzanine card having contact pin outs definitions which are partially or fully mirrored about one axis. The mirror pin outs allow the mezzanine card to be mounted to either side of a two-sided baseboard or motherboard. The ability to mount the mezzanine card on either side of the baseboard significantly reduces the amount of routing required to make side-to-side connections through the baseboard thus freeing space on the baseboard for other signal routing. Further, the dual sided baseboard increases the total number of mezzanine cards that one baseboard can host.

In another aspect, the invention may provide a mezzanine card system comprising: a baseboard with a first and a second surface, having a plurality of mezzanine card receiving areas on each of the first and the second surface; at least one mezzanine card releasably secured to the baseboard adjacent one of the first and second receiving areas, the mezzanine card having a first integrated circuit electrically connected thereto and fixedly attached thereon.

In yet another aspect, an embodiment of the present invention may provide a method of use for a mezzanine card system comprising the steps of: providing a first mezzanine card having an integrated circuit fixedly attached thereon, wherein the circuit is electrically connected to a plurality of pin outs extending outwardly from a surface of the first card; providing a baseboard having a plurality of mezzanine card receiving areas thereon, wherein each receiving area has set of arranged electrically conductive contact pads configured to relay electrical signals through the baseboard; aligning the pin outs of the first mezzanine card with the contact pads on the baseboard; attaching the first mezzanine card to the baseboard such that each pin out is contacting one of the contact pads; exerting pressure between the first mezzanine card and the baseboard; and electrically operating the mezzanine card system by transmitting signals into and out of the circuit through the baseboard and mezzanine card.

BRIEF DESCRIPTION OF THE SEVERAL VIEWS OF THE DRAWINGS

A sample embodiment of the invention, illustrative of the best mode in which Applicant contemplates applying the principles, is set forth in the following description, is shown in the drawings and is particularly and distinctly pointed out and set forth in the appended claims.

FIG. 2A is an enlarged view of callout circle 2A taken in FIG. 2;

Similar numbers refer to similar parts throughout the drawings.

DETAILED DESCRIPTION

Figure 1:
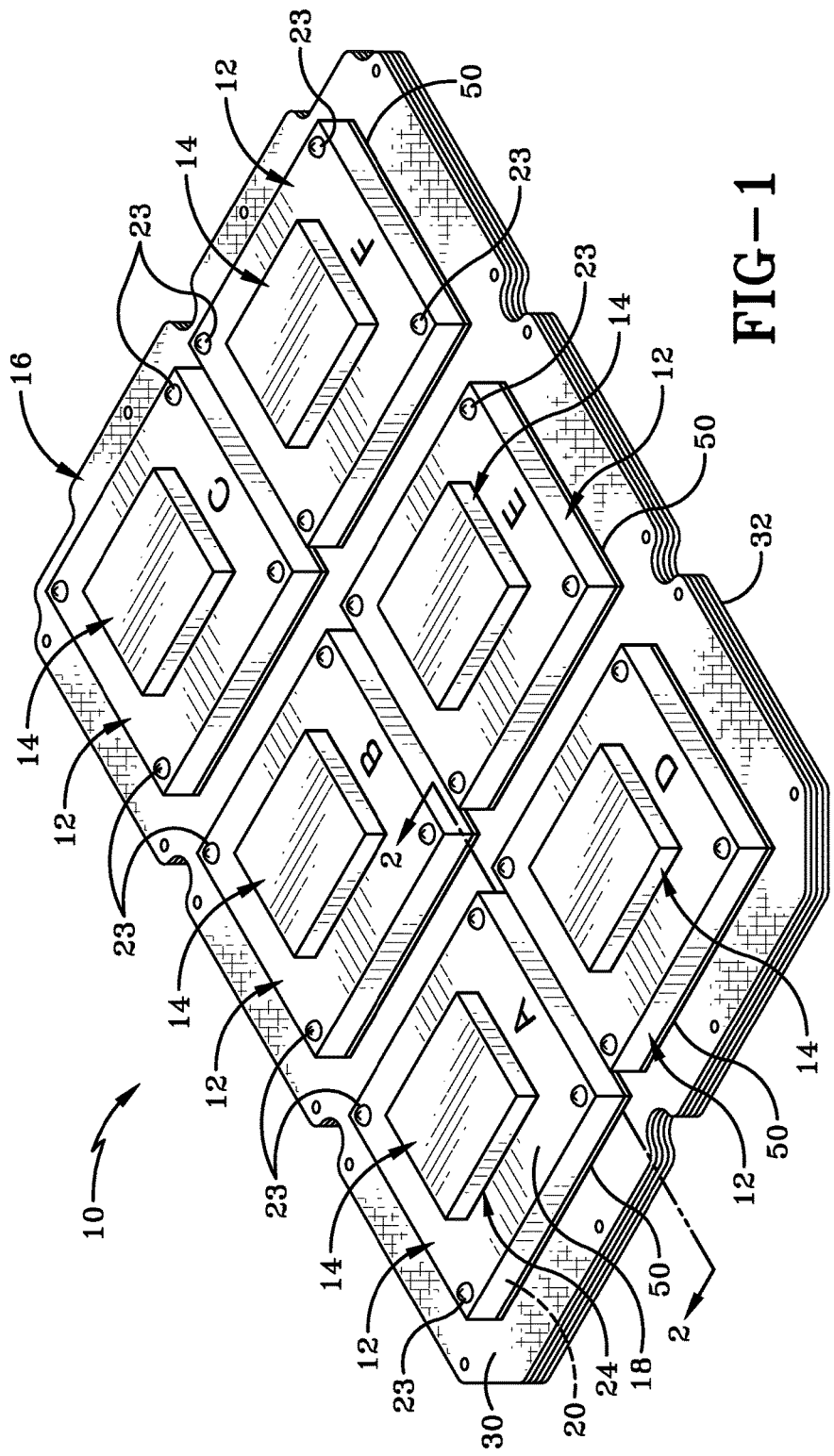
FIG. 1 is an assembled perspective view of an electronic circuit mezzanine card system including a mezzanine card having an integrated circuit thereon, and the mezzanine card attached to a baseboard, in accordance with an embodiment of the present invention.
Figure 2:
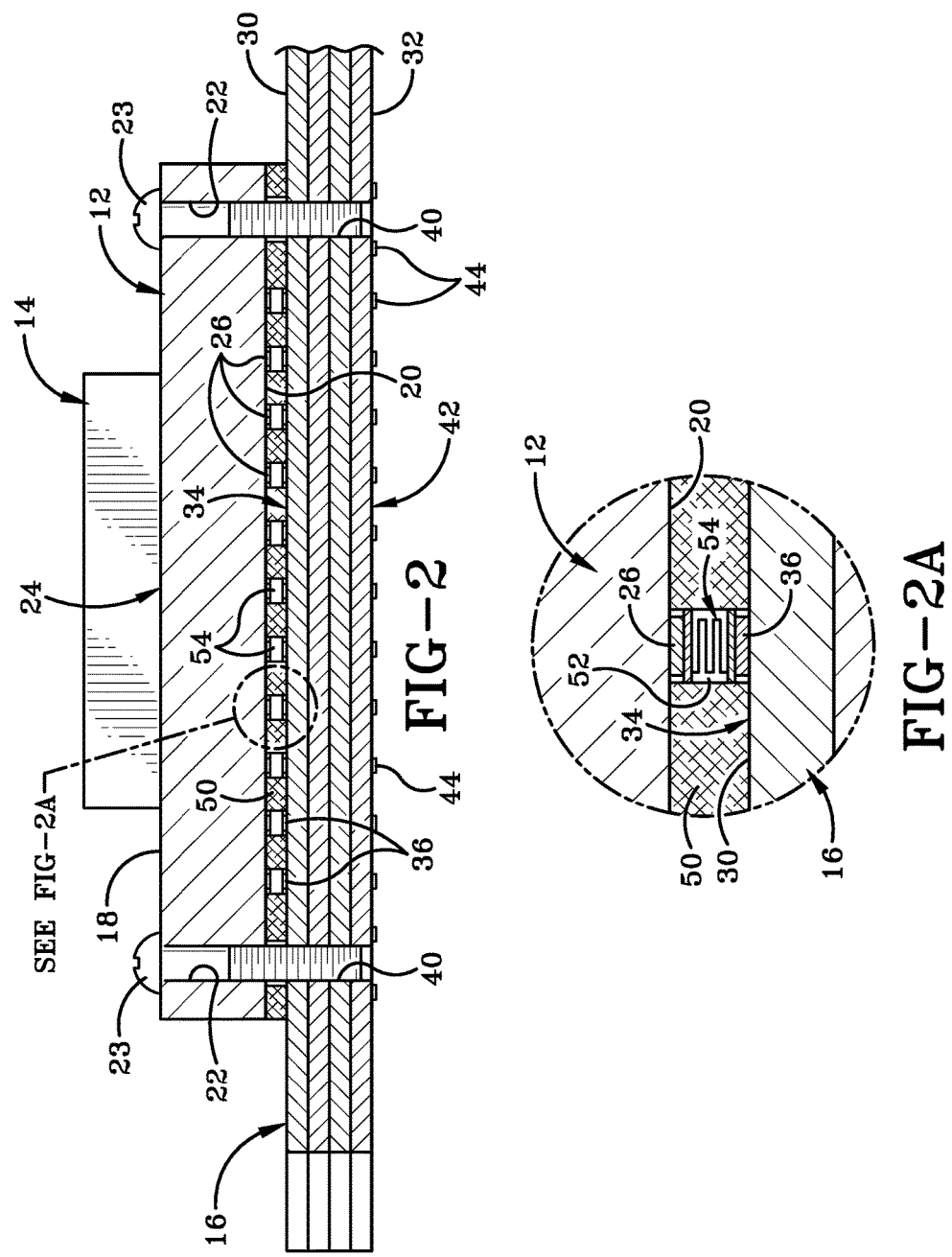
FIG. 2 is a cross section view taken along line 2-2 in FIG. 1.
Figure 3:
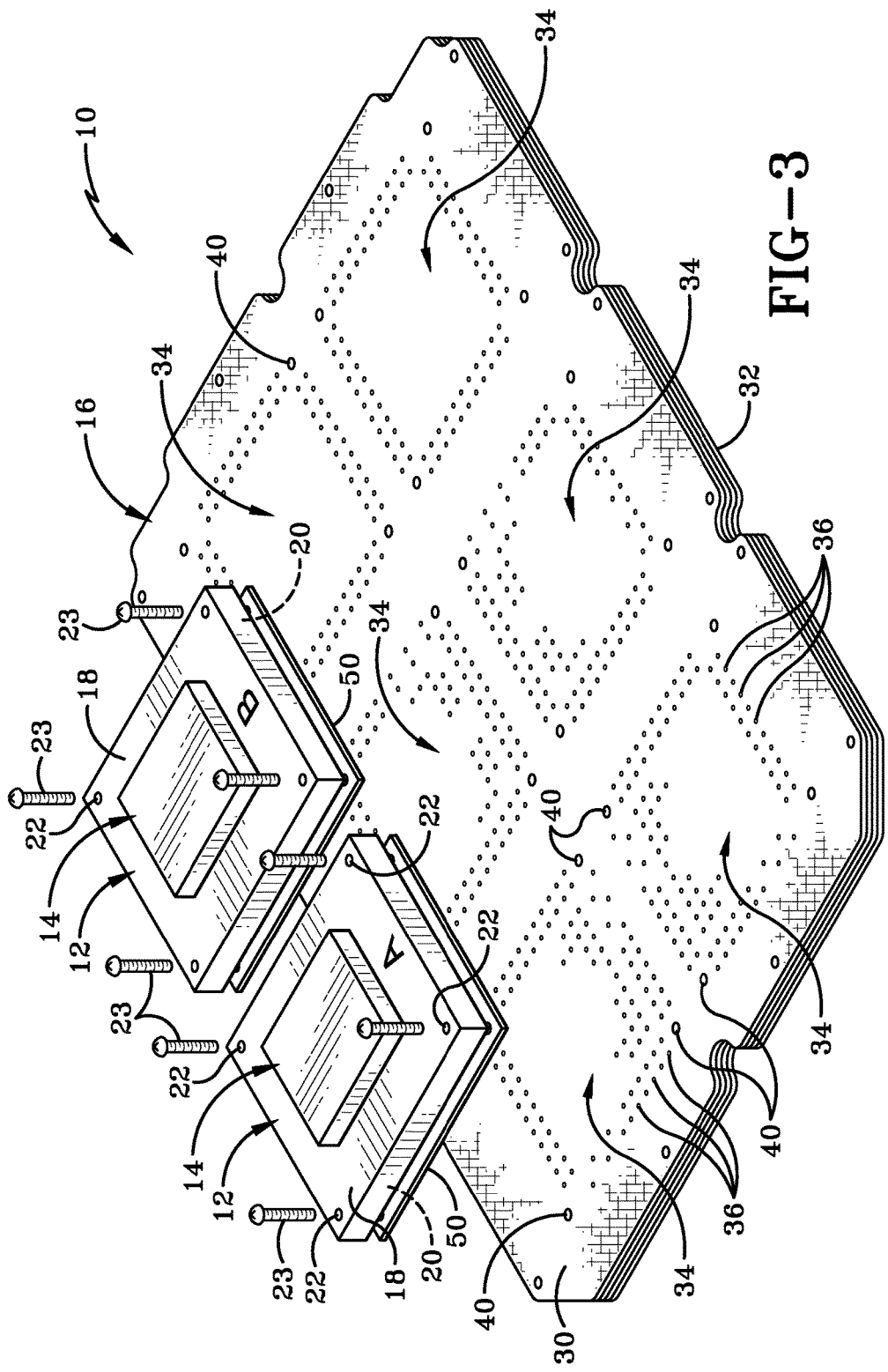
FIG. 3 is an exploded perspective view of the system of the present invention.

An electronic circuit board mezzanine card system of the present invention is shown generally throughout the Figures as 10. As shown in FIGS. 1-3, system 10 comprises at least one mezzanine card or daughter card 12 having a type integrated semiconductor chip or circuit 14 embedded thereon, and a baseboard or motherboard 16 to physically receive the mezzanine card 12 via contact pressure to establish an electrical connection between semiconductor chip 14 and baseboard 16.

The mezzanine card 12 includes a first or top surface 18 and a second or bottom surface 20. First surface 18 faces oppositely of second surface 20. As shown in the Figures first surface 18 is positioned facing upwardly and second surface is positioned facing downwardly, however clearly, system 10 can be configured such that surface 18, 20 are facing in any direction so long as they are opposite facing relative to each other. Card 12 preferably is quadrilateral in shape as shown throughout the Figures. A screw aperture 22 is formed in card 12 adjacent a corner and extends through card 12 from first surface 18 to second surface 20. Screw aperture 22 receives a securing member or screw 23 therethrough to releasably secure card 12 to baseboard 16 with pressure. Preferably, four screw apertures are formed in card 12, each screw aperture adjacent a corner of the card 12, and each screw aperture 22 receiving one screw 23 therethrough. Further, the term screw as used herein refers to any connection member as understood in the art to connected two circuit boards together to exert a connective pressure between card 12 and baseboard 16.

A circuit receiving area 24 is located on the first surface of card 12. Receiving area 24 is positioned inwardly from the edges of card 12. Receiving area 24 is configured to fixedly receive semiconductor chip 14 thereon. When semiconductor chip 14 is connected to card 12, semiconductor chip 14 and mezzanine card 12 are in electrical communication, preferably the semiconductor chip 14 and card 12 electrically communicate via wiring (not shown) as understood in the art. When semiconductor chip 14 is fixedly attached to card 12, together they may be removed from or swapped out of system 10 as one piece or unit when improved circuits are later developed by third party sources (as described in detail below). Positioned oppositely on card 12 from circuit receiving area 24, along the second surface 20, is a plurality of contact pins or pin outs 26. As shown in FIG. 2A, pin outs 26 form a portion of second surface 20. The pin outs 26 extend outwardly beyond the planar portion of second surface 20 of card 12. Pin outs 26 are electrically conductive and configured to transmit a signal from semiconductor chip 14 through mezzanine card 12 to baseboard 16.

Figure 6:
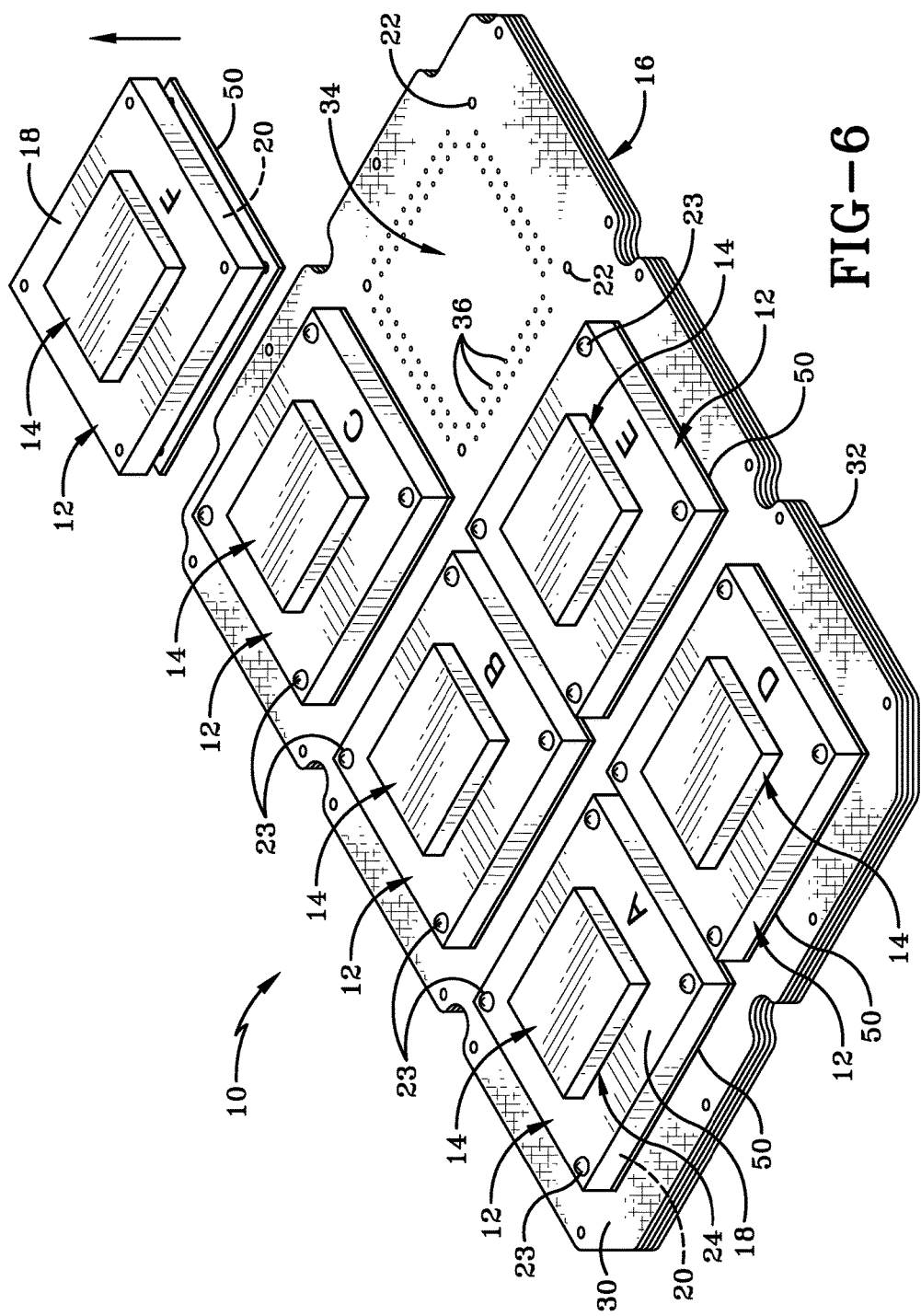
FIG. 6 is an operational perspective view of the system depicting a removable mezzanine card.
Figure 7:
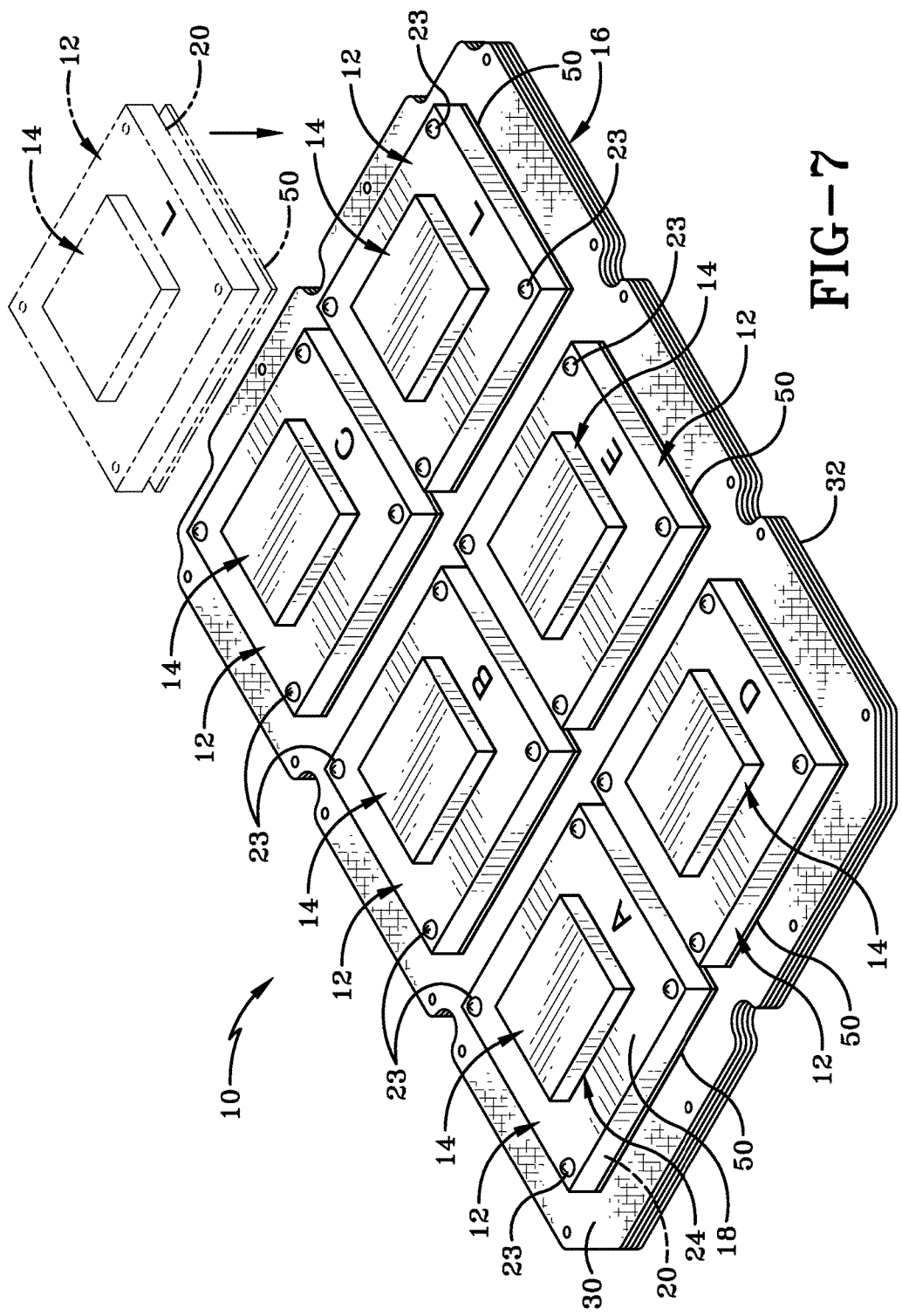
FIG. 7 is an operational perspective view of the system depicting a second removable mezzanine card replacing the first removable mezzanine card of FIG. 6.

The integrated semiconductor chip 14, also known as a chip or microchip, includes one or more electronic circuits on a small plate of semiconductor material, normally silicon. Chip 14 has an outwardly facing first surface and an outwardly facing second surface that faces opposite the circuit first surface. Chip 14 can include any one or combination of transmitter, receivers, resistors, transistors, gate arrays, or other discrete circuits as understood in the art depending on the computing power desired by the user. Second surface of chip 14 is disposed closely adjacent card 12 within the circuit receiving area 24. Chip 14 is electrically connected, preferably by wiring, and fixedly attached, preferably by soldering, to card 12, so as to create one piece or unit that is modularly connectable or removable from baseboard 16 (FIG. 6-7). These pieces or units are labeled via reference letters and shown as A, B, C, D, E, F, and L, respectively throughout the Figures. Each chip 14 on each respective unit A, B, C, D, E, F, and L is different than a chip 14 on a different unit.

In the preferred embodiment of system 10, chip 14 on at least one unit F is a Field Programmable Gate Array (FPGA). FPGA Chip 14 permits system 10 to be reprogrammed in the battlefield once a unit has been swapped out or replaced (FIG. 6-7). System 10 will then have the ability to perform a new function in accordance with the programming of the second unit L, without the need of redesigning, rewiring, or re-printing a wire baseboard. Although an FPGA is preferred, clearly chip 14 could be alternative types of integrated circuits, such as, ADCs, DACs, transistors, resistors, transmitter, receivers or the like, as would be well understood in the art.

With continued reference to FIGS. 1-3, the baseboard or motherboard 16 is a printed wire board and includes a first or top planar surface 30 spaced apart from and oppositely facing a baseboard second or bottom planar surface 32. Baseboard surfaces 30, 32 are bound by spaced apart edges forming a generally quadrilateral shaped baseboard 16. Board 16 may comprises chamfered corners or other hemispherical recess along the edges as understood in the art and shown in the Figures. Regarding the dimensions of baseboard 16, preferably when system 10 is used as an Electronic Warfare (EW) module, baseboard 16 will be rectangular in shape and about 6"×9" to host up to about 10 mezzanine cards on each planar surface 30, 32, (twenty mezzanine cards total) however if system 10 is used as a commercial equivalent, baseboard 16 smaller than the EW module and sized to host from about 2 to about 10 cards on each side 30, 32. Other baseboards 16 may be rectangular in shape and about 8"×10" to more than 10 mezzanine cards on each planar surface 30, 32.

Additionally, system 10 may include an interposer 50 (FIG. 2A) positioned between the second surface 20 of card 12 and the first surface 30 of baseboard 16. Interposer 50 may be either passive or active. Passive interposers simply pass through the transmitted signals, while active interposers regenerate the transmitted signals to ensure reliable communication between the devices (i.e., the mezzanine card 12 with chip 14 and baseboard 16) with the interposer 50 in place. Interposer 50 defines a plurality of apertures 52 (FIG. 2A) configured to permit pin outs 26 to contact a plurality of contact pad areas 34 under pressure. Interposer 50 further comprises a compressible pressure connector 54 disposed within aperture 52. Pressure connector 54 has a top pad to contact pin out 26 and a bottom pad to contact pad 36. When compressed, pressure connector 54 electrically connects pin outs 26 to pad 36 allowing a signal to be sent therethrough.

Figure 4:
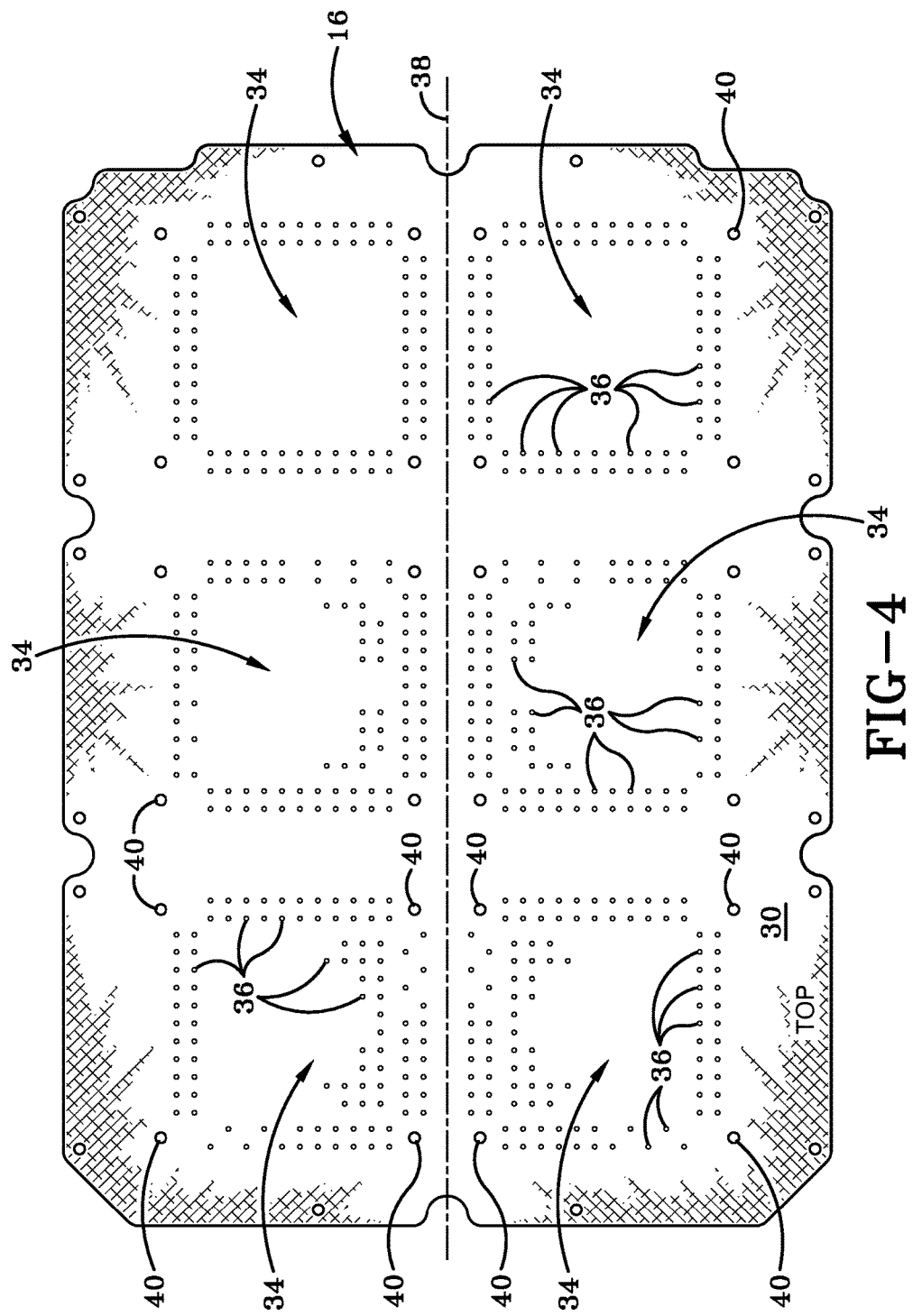
FIG. 4 is a top view of the baseboard.

As shown in FIG. 4, a plurality of top surface contact pad areas 34 are positioned atop or adjacent the top surface 30 of board 16. Within each top pad area 34 are a plurality of contact pads 36. The contact pads 36 are the ends of electrically conductive wiring (not shown) hardwired and extending through the baseboard 16 as understood and well known in the art. Contact pads 36 transmit an electric signal to or from semiconductor chip 14 fixedly attached on mezzanine card 12. Pads 36 further transmit signal to or from an electrically connected processor (not shown) as part of a larger computer system (not shown).

With continued reference to FIG. 4, an imaginary axis of symmetry 38 is laterally centered and extends longitudinally across baseboard 16. When viewed from above, the imaginary axis 38 is oriented laterally from left to right (FIG. 4) each set of first surface contact pads 36 within a respective first surface pad area 34 are reflectively symmetrical about axis 38 with a second set of contact pads within a separate pad area on the top surface. For example, as seen in FIG. 3, the pin 36 configuration in top pad area 34 that receives Unit A is reflectively symmetrical about axis 38 of the pin configuration 36 that receives Unit D; and the pin configuration that receives Unit B is reflectively symmetrical about axis 38 of the pin configuration 36 that receives Unit E; and so on as shown in the Figures.

Figure 5:
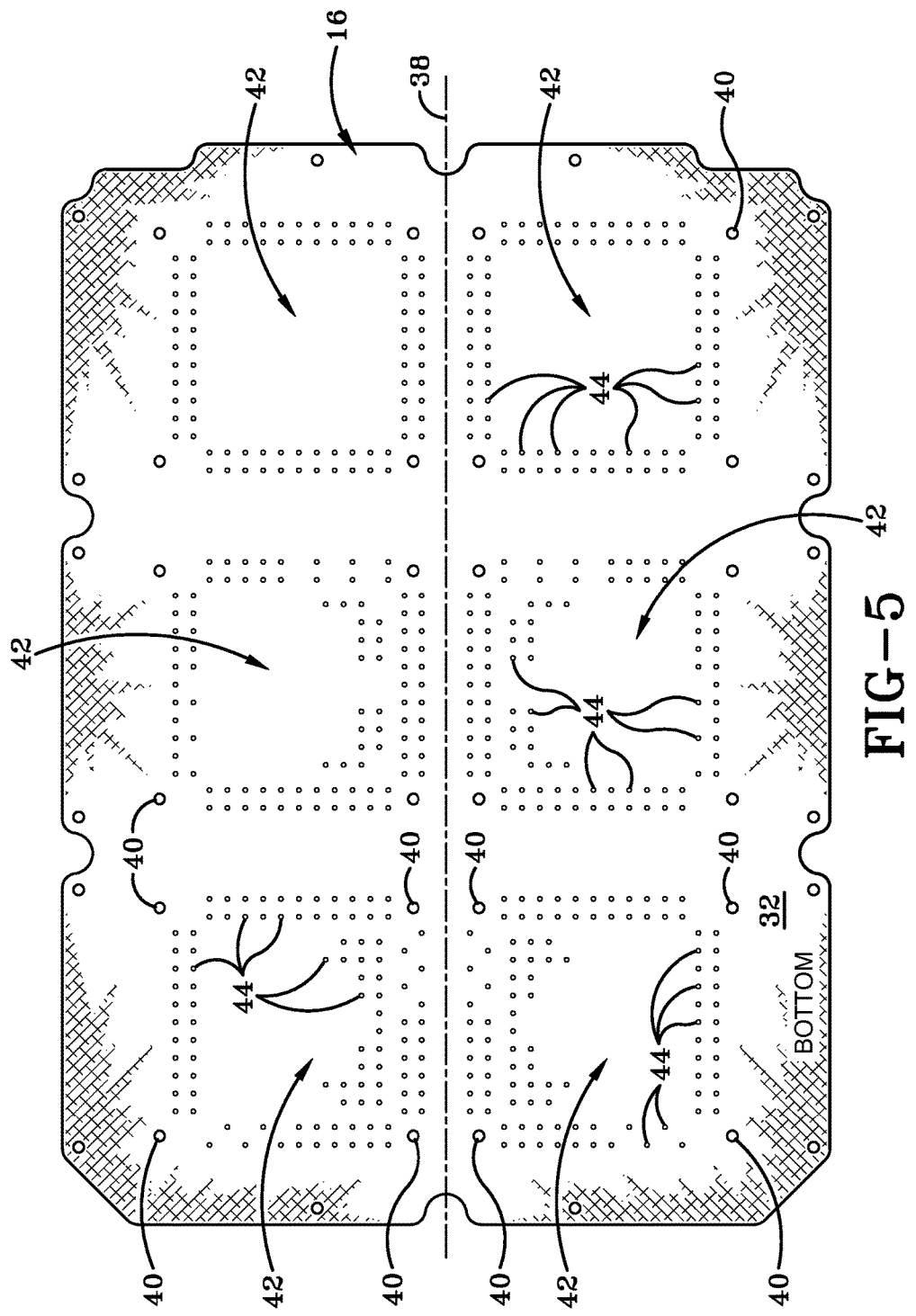
FIG. 5 is a bottom view of the baseboard.

With reference to FIG. 5, a plurality of bottom surface contact pad areas 42 are positioned adjacent the bottom surface 32 of board 16. Within each bottom pad area 42 are a plurality of contact pads 44. The contact pads 44 are the ends of electrically conductive wiring (not shown) hardwired and extending through the baseboard 16 as understood and well known in the art. Contact pads 44 transmit an electric signal to or from semiconductor chip 14 fixedly attached on mezzanine card 12. Pads 44 further transmit signal to or from an electrically connected processor (not shown) as part of a larger computer system (not shown).

With continued reference to FIG. 5, an imaginary axis of symmetry 38 is laterally centered and extends longitudinally across baseboard 16. When viewed from above, the imaginary axis 38 is oriented laterally from left to right (FIG. 5) each set of second surface contact pads 44 within a respective second surface pad area 42 are reflectively symmetrical about axis 38 with a second set of contact pads within a separate pad area on the bottom surface 32. Further, each set of second surface contact pads 44 layout within a respective second surface pad area 42 are symmetrical with the pad 36 layout within a first surface pad area 34 on the top surface 30. Stated otherwise, if one is viewing the top of baseboard 16 from above (FIG. 4) and then rotates the entire board 180 degrees about axis 38 so as to now be viewing the bottom surface (FIG. 5), the pad areas 42 of bottom surface 32 would viewably have the same arranged pin 44 layout as the pin 36 layout of the top surface 30.

Baseboard 16 includes a plurality of screw receiving apertures 40 formed in the baseboard and extending at least partially through board 16. Apertures 40 are configured to align with apertures 22 on card 12 so screws 23 may releasably attach card 12 to board 16. Screw 23 is threaded through aperture 22 into board aperture 40 so as to create a pressure contact between pin 26 and contact pad 36 or 44. The amount of pressure exerted by screw 23 is dependent on how tightly screw 23 is threadedly rotated into aperture 40.

With continued reference to FIGS. 4-5, the first and second surfaces 30, 32 of baseboard 16 are plated or finished with a Electroless Nickel/Electroless Palladium/Immersion Gold (ENEPIG) plated surface finish. ENEPIG is a tertiary layered surface finish plated over copper as the basis metal.

ENEPIG comprises an electroless nickel base layer over which is plated an electroless palladium barrier layer followed by a deposit of thin immersion gold as the final outer layer. The electroless palladium layer forms a diffusion barrier that impedes nickel diffusion to the gold surface. The immersion gold protects the palladium layer from reacting with contaminants prior to the plating process that might otherwise affect the joining process. The ENEPIG coating further covers or plates all the contact pads 36, 44 on each respective first or second surface 30, 32.

In accordance with an aspect of the present invention as herein described above, system 10 having symmetrically arranged top and bottom contact pads 36, 44 permits card 12 to be attached to either the top or bottom contact pad area 34, 42 respectively. The mirrored (i.e., symmetrical) relationship permits the system to continue to operate regardless of whether card 12 is connected to the top or bottom of baseboard 16. The symmetry permits system 10 to operate without causing an explosion or malfunction of the computer system when a card 12 is swapped from one side to the other 30, 32. The mirrored pads 36, 44 further allow a user to remap or reprogram the same mezzanine card 12 after being swapped to an opposite side of the baseboard 16.

In accordance with another aspect of the present invention as herein described above, top contact pads 36 and bottom contact pads 44 are durable pressure contacts. Pads 36, 44 are designed to operate even when exposed to moisture and will have anti-corrosive properties as understood in the art. Pads 36, 44 undergo an ENEPIG plating process with baseboard 16 (as described above) to give pads 36, 44 these properties.

In accordance with another aspect of the invention, system 10 permits mezzanine cards 12 having semiconductor chips 14 embedded thereon to be easily replaced when improved circuit technology is released without the need for redesigning the hardware (i.e., the printed wiring) in baseboard 16. Contact pin outs 26 on the bottom of card 12 can remain in a standard or uniform arrangement across all cards 12. Each card 12 may then have a different chip 14 (as discussed above) embedded thereon. This permits a user to create a custom electronic warfare module without having to redesign any hardware so the user can have more receiving channels or more transmitting channels by swapping out a first chip 14, such as analog-to-digital converters (ADCs), Digital-to-Analog converters (DACs), FPGAs, transmitters, receivers, or the like, for a second chip as needed.

In accordance with the preferred embodiment as herein described above, system 10 is used as an Electronic Warfare module. The pressure of screws 23 keep good electrical contact between pin outs 26 and pads 36, 44, to reduce exposure to moisture or dust, etc. but allows for system 10 improvements and upgrades as technology comes out or alternative system computing functionality is needed, without the need for re-soldering any motherboard.

In accordance with another aspect of the present invention as herein described above, system 10 drastically reduces the amount of time it takes to reproduce an electrical system utilizing system 10 advances. For further background, when an FPGA is attached directly to a motherboard or baseboard and the FPGA is programmed to execute a function, the printed wire baseboard may then execute that function. If a user desires that the FPGA execute a new function, the baseboard must be redesign, rewired, and reprinted to accommodate the new functioning FPGA or other integrated circuit. Those having ordinary skill in the art will recognize and know that it can take upwards of 15 months to redesign, rewire, and reprint a motherboard to execute a new function in accordance with the new FPGA or integrated circuit. The named inventors of System 10 understand and appreciate the exponentially evolving circuitry technology rapidly occurring in present times. As such, system 10 allows provides a mezzanine card 12 to act as a type of adapter, thus allowing integrated circuit technology to continually improve without the need to rewire, reprint or re-solder the printed wire baseboard 16. The mezzanine card 12 of system 10 reduces reprogramming time from 15 months to about six weeks. This drastic reduction in reprogramming time provides great advantages for circuitry systems, especially when these systems are used within battlefield and electronic warfare technology.

In operation, a user will collect one or more units from a plurality of units A, B, C, D, E, F; each unit comprising mezzanine card 12 having semiconductor chip 14 fixedly attached thereon to perform a given function. User can configure or program units A, B, C, D, E, F with a desired semiconductor chip 14, such as a gate array, to accomplish a specific task of system 10. Or, semiconductor chip 14 may have a predetermined function such as a transmitter, receiver, FPGA, transistor, a resistor, an ADC, or a DAC.

System 10 is constructed by aligning a respective unit A, B, C, D, E, or F with a receiving area 34 on the top surface 30 or align a unit with a receiving area 42 on bottom surface 32. When properly aligned, pin outs 26 extending from the bottom of card 12 make contact with all top contact pads 36 or bottom contact pads 44 in a respective receiving area 34, 42.

Each respective unit is releasably attached to board 16 by a securing member or screws 23. Screws are tightened to create or exert a pressure between the pin outs 26 and the top contact pads 36 or bottom contact pads 44. The pressured contact creates and electrical connection between semiconductor chip 14 and baseboard 16. Once an electrical connection has been created under pressure, signals may be transmitted to or from semiconductor chip 14 through card 12 and baseboard 16 to computer system (not shown) to perform a desired task. The pressured contact connection assists in keeping an electrical connection or circuit establish in system 10 when it is in a harsh environments subjected to wind, dirt, dust, or moisture, as is often the case in warfare environments.

Further, often times in warfare environments, the computing and processing needs of electronic warfare computer systems change rapidly due to evolving conditions, such as improved enemy combatant firearm technology and improved enemy covert communications. System 10 can be easily upgraded to accommodate these computing needs.

For example, with primary reference to FIGS. 6.7, the lettered units of the card 12 and semiconductor chip 14 may be swapped out when circuit technology improves or the system 10 requires a different function of semiconductor chip 14 to be performed. When an improved semiconductor chip 14 is released by a manufacturer, it is embedded or fixedly attached to a mezzanine card 12. The first unit (Unit F, FIG. 6) is removed from baseboard 16 by unscrewing screw 23 and separating the first unit from the baseboard 16. Then, a second unit (Unit L, FIG. 7) may be added to the receiving area 34 previously occupied by the first unit. The second unit may be releasably attached using screws 23 to create a pressured electrical connection to withstand the warfare or rugged environment.

Further, as described above, the contact pad 36, 42 layouts are reflectively symmetrical about axis 38, as well as symmetrical on each respective surface 30, 32. A unit may be swapped from the first surface 30 of baseboard 16 to the second surface 32 of baseboard 32, or vice versa. Or, a unit may be swapped and rotated 180 degrees so that it may be attached on the same surface in the receiving area opposite the axis of symmetry 38. This symmetrical pad layout provides increase utility for the use of circuits 14 as they need to be updated, upgraded, reconfigured or swapped as necessary, and as one would understand in the art.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 8:
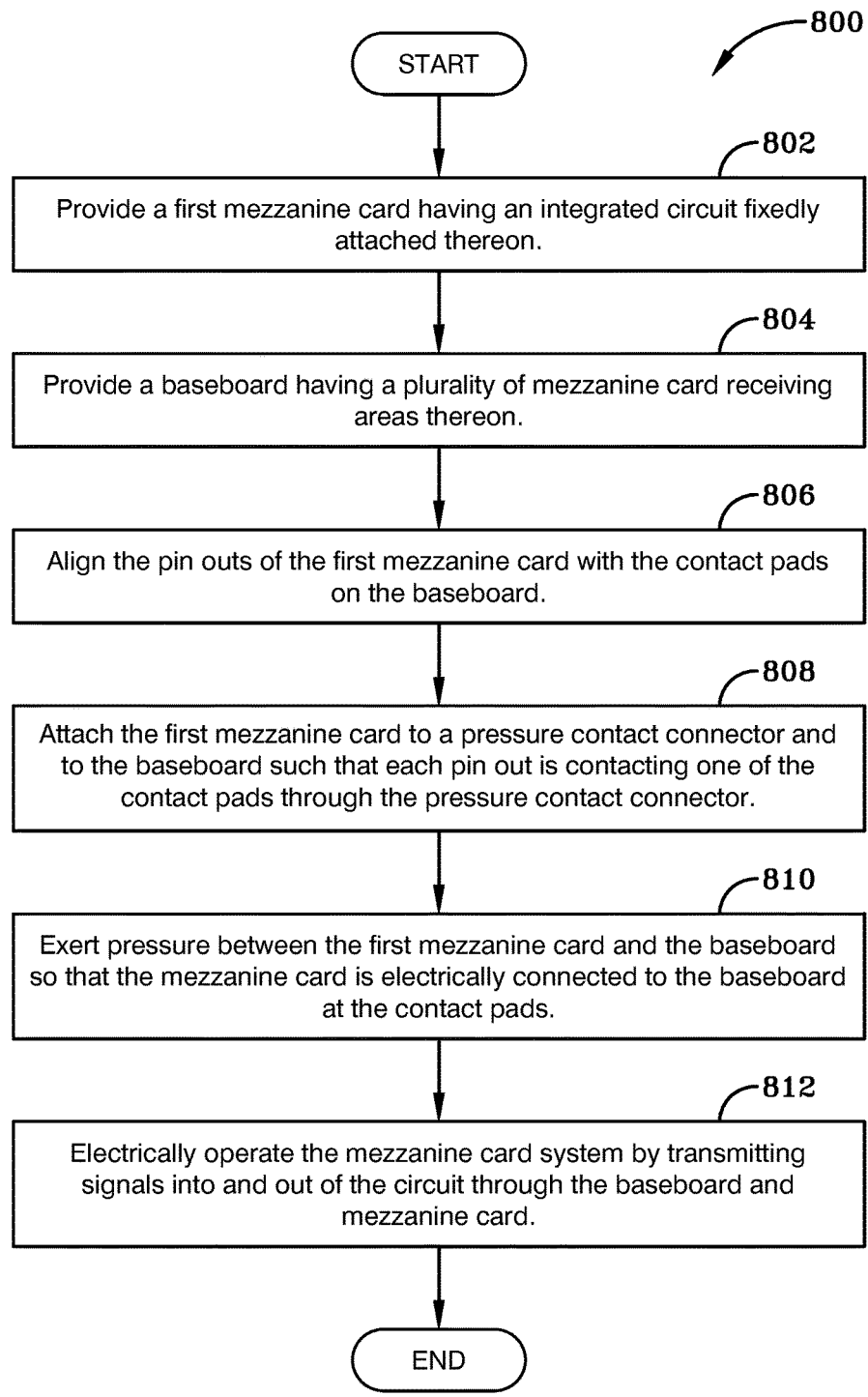
FIG. 8 illustrates the preferred embodiment configured as an example method of attaching integrated circuits to a baseboard using mezzanine cards and later replacing and integrated circuit and its mezzanine card with a new integrated circuit and its new mezzanine card.

FIG. 8 illustrates a method 800 for the use for a mezzanine card system that allows for the replacement of older Integrated Semiconductor Chips or Circuits (ICs) with newer ICs. The method 800 begins by providing a first mezzanine card having an integrated circuit fixedly attached thereon, at 802. The integrated circuit is electrically connected to a plurality of pin outs extending outwardly from a surface of the first card. The method 800 next provides a baseboard having several mezzanine card receiving areas thereon, at 804. Each receiving area has set of arranged electrically conductive contact pads configured to relay electrical signals through the baseboard. The pin outs of the first mezzanine card are aligned, at 806, with the contact pads on the baseboard. The first mezzanine card is attached to a pressure contact on the baseboard, at 808, such that each pin out is contacting one of the contact pads through the pressure contact connector. Pressure is exerted between the first mezzanine card and the baseboard so that the mezzanine card is electrically connected to the baseboard at the contact pads, at 810. The mezzanine card system is electrically operated by transmitting signals into and out of the circuit or chip through the baseboard and mezzanine card.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of the preferred embodiment of the invention are an example and the invention is not limited to the exact details shown or described.

The invention claimed is:

1. A mezzanine card system comprising:
   a baseboard with a first surface and an opposed second surface;
   a plurality of mezzanine card receiving areas defined on each of the first surface and the second surface of the baseboard, said plurality of mezzanine card receiving areas including:
   a first mezzanine card receiving area on the first surface;
   a second mezzanine card receiving area on the first surface, wherein the first and second mezzanine card receiving areas are arranged symmetrical about an imaginary axis extending longitudinally across the first surface of the baseboard;
   a set of electrical contacts provided in each of the first and second mezzanine card receiving areas; wherein each set of electrical contacts is arranged in a pattern and wherein the pattern of the set of electrical contacts in the first mezzanine card receiving area is mirrored by the pattern of the set of electrical contacts in the second mezzanine card receiving area;
   at least one mezzanine card selectively releasably securable to the set of electrical contacts in either of the first or second mezzanine card receiving areas.

2. The mezzanine card system of claim 1, further comprising:
   a securing member that releasably secures the first mezzanine card to the baseboard adjacent one or the other of the first or second mezzanine card receiving areas on the first surface.

3. The mezzanine card system of claim 2, wherein the securing member is a screw;
   wherein the screw extends through an aperture formed in the mezzanine card and is at least partially threadedly received into a screw receiving aperture formed in the baseboard.

4. The mezzanine card system of claim 1,
   wherein one of the first and second surfaces has an Electroless Nickel/Electroless Palladium/Immersion Gold (ENEPIG) plated finish.

5. The mezzanine card system of claim 4, wherein each of the first and second surfaces has an ENEPIG plated finish.

6. The mezzanine card system of claim 1, further comprising:
   an interposer positioned between the baseboard and the mezzanine card;
   a plurality of apertures formed in the interposer to permit a pin out on the mezzanine card to electrically engage one of the set of electrical contacts on the baseboard.

7. The mezzanine card system of claim 1, further comprising:
   a first integrated semiconductor chip electrically connected to the mezzanine card and fixedly attached thereto.

8. The mezzanine card system of claim 1, wherein the plurality of mezzanine card receiving areas further comprises:
   a first mezzanine card receiving area on the second surface;
   a second mezzanine card receiving area on the second surface, wherein the first and second mezzanine card receiving areas on the second surface are arranged symmetrical about an imaginary axis extending longitudinally across the second surface of the baseboard; and
   a set of electrical contacts provided in each of the first and second mezzanine card receiving areas on the second surface; wherein each set of electrical contacts thereon is arranged in a pattern and wherein the pattern of the set of electrical contacts in the first mezzanine card receiving area on the second surface is mirrored by the pattern of the set of electrical contacts in the second mezzanine card receiving area on the second surface.

9. The mezzanine card system of claim 7, further comprising:
   a second mezzanine card; a second integrated semiconductor chip embedded on the second mezzanine card, wherein the second integrated semiconductor chip is adapted to perform a different function than the first integrated semiconductor chip on the first mezzanine card, and wherein the second mezzanine card is selectively releasably securable to the set of electrical contacts in either of the first and second mezzanine card receiving areas when the first mezzanine card is removed therefrom.

10. The mezzanine card system of claim 8, wherein the pattern of the sets of electrical contacts in the first and second mezzanine card receiving areas on the first surface is substantially identical to the pattern of the sets of electrical contacts in the first and second mezzanine card receiving areas on the second surface of the baseboard.

11. The mezzanine card system of claim 7, wherein the first integrated semiconductor chips is one of the group of: a field programmable gate array, a transmitter chip, and a receiver chip.

12. The mezzanine card system of claim 8, wherein the pattern of the set of electrical contacts provided in the first and second mezzanine card receiving areas on the second surface are substantially identical to the pattern of the set of electrical contacts provided in the first and second mezzanine card receiving areas on the first surface.

13. The mezzanine card system of claim 1, wherein the plurality of mezzanine card receiving areas further comprises:
   a third mezzanine card receiving area on the first surface;
   a fourth mezzanine card receiving area on the first surface, wherein the third and fourth mezzanine card receiving areas on the first surface are arranged symmetrical relative to each other about the imaginary axis extending longitudinally across the first surface of the baseboard; and
   a set of electrical contacts provided in each of the third and fourth mezzanine card receiving areas on the first surface; wherein each set of electrical contacts thereon is arranged in a pattern and wherein the pattern of the set of electrical contacts in the third mezzanine card receiving area on the first surface is mirrored by the pattern of the set of electrical contacts in the fourth mezzanine card receiving area on the first surface; and wherein the pattern of the sets of electrical contacts in the third and fourth mezzanine card receiving areas are the same as the pattern of the sets of electrical contacts in the first and second mezzanine card receiving areas.

14. The mezzanine card system of claim 1, wherein the plurality of mezzanine card receiving areas further comprises:
   a third mezzanine card receiving area on the first surface;
   a fourth mezzanine card receiving area on the first surface, wherein the third and fourth mezzanine card receiving areas on the first surface are arranged symmetrical relative to each other about the imaginary axis extending longitudinally across the first surface of the baseboard; and
   a set of electrical contacts provided in each of the third and fourth mezzanine card receiving areas on the first surface; wherein each set of electrical contacts in each of the third and fourth mezzanine card receiving areas is arranged in a pattern and wherein the pattern of the set of electrical contacts in the third mezzanine card receiving area on the first surface is mirrored by the pattern of the set of electrical contacts in the fourth mezzanine card receiving area on the first surface; and wherein the pattern of the sets of electrical contacts in the third and fourth mezzanine card receiving areas is different to the pattern of the sets of electrical contacts in the first and second mezzanine card receiving areas.

15. The mezzanine card system of claim 13, wherein the plurality of mezzanine card receiving areas further comprises:
   a first mezzanine card receiving area on the second surface;
   a second mezzanine card receiving area on the second surface, wherein the first and second mezzanine card receiving areas on the second surface are arranged symmetrical about an imaginary axis extending longitudinally across the second surface of the baseboard; and
   a set of electrical contacts provided in each of the first and second mezzanine card receiving areas on the second surface; wherein each set of electrical contacts thereon is arranged in a pattern and wherein the pattern of the set of electrical contacts in the first mezzanine card receiving area on the second surface is mirrored by the pattern of the set of electrical contacts in the second mezzanine card receiving area on the second surface;
   a third mezzanine card receiving area on the second surface;
   a fourth mezzanine card receiving area on the second surface, wherein the third and fourth mezzanine card receiving areas on the second surface are arranged symmetrical relative to each other about the imaginary axis extending longitudinally across the second surface of the baseboard; and
   a set of electrical contacts provided in each of the third and fourth mezzanine card receiving areas on the second surface; wherein each set of electrical contacts thereon is arranged in a pattern and wherein the pattern of the set of electrical contacts in the third mezzanine card receiving area on the second surface is mirrored by the pattern of the set of electrical contacts in the fourth mezzanine card receiving area on the second surface; and wherein the pattern of the sets of electrical contacts in the third and fourth mezzanine card receiving areas on the second surface are the same as the pattern of the sets of electrical contacts in the third and fourth mezzanine card receiving areas on the first surface.

16. The mezzanine card system of claim 2, wherein the securing member exerts a pressure on the mezzanine card and the baseboard and creates a pressured electrical contact connection between the first mezzanine card and the baseboard.

* * * * *